(12) United States Patent
Murakami

(10) Patent No.: US 6,555,884 B1
(45) Date of Patent: Apr. 29, 2003

(54) SEMICONDUCTOR DEVICE FOR PROVIDING A NOISE SHIELD

(75) Inventor: Tadamasa Murakami, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 0 days.

(21) Appl. No.: 09/717,308

(22) Filed: Nov. 22, 2000

(30) Foreign Application Priority Data

Jun. 30, 2000 (JP) ........................................ 2000-198120

(51) Int. Cl.[7] ........................ H01L 29/74; H01L 31/119
(52) U.S. Cl. ........................ 257/409; 257/170; 257/490; 257/452; 257/484; 257/495; 257/368
(58) Field of Search ................................. 257/452, 339, 257/355–358, 659, 499, 409, 629, 127, 170, 484, 495, 605, 490, 368; 438/48, 570

(56) References Cited

U.S. PATENT DOCUMENTS 5,491,358 A * 2/1996 Miyata
5,828,110 A * 10/1998 Wollesen
6,078,085 A * 6/2000 Suzuki
6,384,463 B1 * 5/2002 Miles et al.

OTHER PUBLICATIONS

Kuntal Joardar, "A Simple Approach to Modeling Cross–Talk in Integrated Circuits", IEEE Journal of Solid–State Circuits, vol. 29, No. 10, Oct. 1994.

* cited by examiner

*Primary Examiner*—Wael Fahmy, Jr.
*Assistant Examiner*—Dilinh Nguyen
(74) *Attorney, Agent, or Firm*—Venable; James R. Burdett

(57) ABSTRACT

A first guard ring formed by high concentration ion diffusion is established around the transistor formation region of the semiconductor substrate. A second guard ring is established around the first guard ring with a prescribed gap therebetween. A metal film is formed opposing to each guard ring with an insulating film interposed therebetween; these metal films are connected to the opposing guard rings by interlayer wires. The metal films are each connected to external terminals providing a standard potential by individual metal wires from their respective electrodes.

17 Claims, 3 Drawing Sheets

SEMICONDUCTOR DEVICE FOR PROVIDING A NOISE SHIELD

BACKGROUND OF THE INVENTION

1. Field of the Invention

The present invention relates to a semiconductor device, and more particularly to a guard ring structure for providing a noise shield.

2. Description of Related Art

In conventional semiconductor devices, a conductive region called a guard ring surrounds transistors formed on a semiconductor substrate. Connecting this guard ring to a ground potential shields the transistors from external noise input.

However, conventional semiconductor devices have the following problems.

The guard ring is formed as a conductive region wherein a high concentration of ions is diffused around the region on the semiconductor substrate where transistors are formed. For this reason, it is difficult to provide a resistance of zero entirely to the resistor portion of the guard ring and it is not possible to provide complete shielding from the effects of the external noise, especially in the case of high amplification transistors.

SUMMARY OF THE INVENTION

It is an object of the present invention to provide a semiconductor device comprising a guard ring that can effectively shield out external noise and resolve the problems with the abovementioned conventional art.

In order to resolve the abovementioned problems, the present invention is a semiconductor device comprising: a circuit region including transistors formed on the semiconductor substrate; a first guard ring of an ion diffused region formed around the abovementioned circuit region; a second guard ring of a high concentration ion diffused region formed around the abovementioned first guard ring with a prescribed gap therebetween; a first metal film pattern formed opposing to the abovementioned first guard ring with an insulating film interposed therebetween and that is connected to the first guard ring by a plurality of interlayer wires; a second metal film pattern formed opposing to the abovementioned second guard ring with the abovementioned insulating film interposed therebetween and that is connected to the second guard ring by a plurality of interlayer wires; a first metal wire connecting the abovementioned first metal film pattern to an external terminal to which a standard potential is provided; and a second metal wire connecting the abovementioned second metal film pattern to the abovementioned external terminal.

The present invention effects the following actions because the semiconductor device is constituted as above.

The first guard ring formed around the circuit region has the difference in potential within the ring eliminated and is connected to a standard potential by the first metal film pattern. Furthermore, the guard ring formed around the first guard ring has the difference in potential within the ring eliminated and is connected to the same standard potential as the first ring by the second metal film pattern.

External noise is thereby effectively shielded by the first and second guard rings and its influence on the circuit region can be eliminated.

BRIEF DESCRIPTION OF THE DRAWINGS

The forgoing and other objects, features and advantages of the present invention will be better understood from the following description taken in connection with the accompanying drawings, in which.

DESCRIPTION OF THE PREFERRED EMBODIMENTS

First Embodiment

Figure 1A:
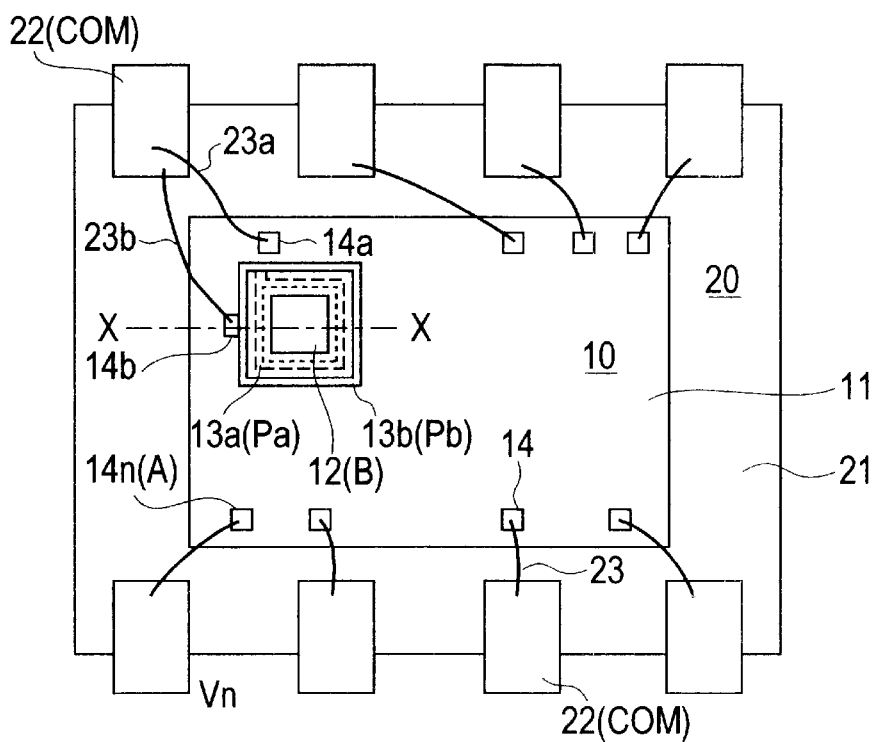
FIG. 1 (including FIG. 1(A) and FIG. 1(B)) is a drawing showing the constitution of a semiconductor device relating to a first embodiment of the present invention.
Figure 1B:
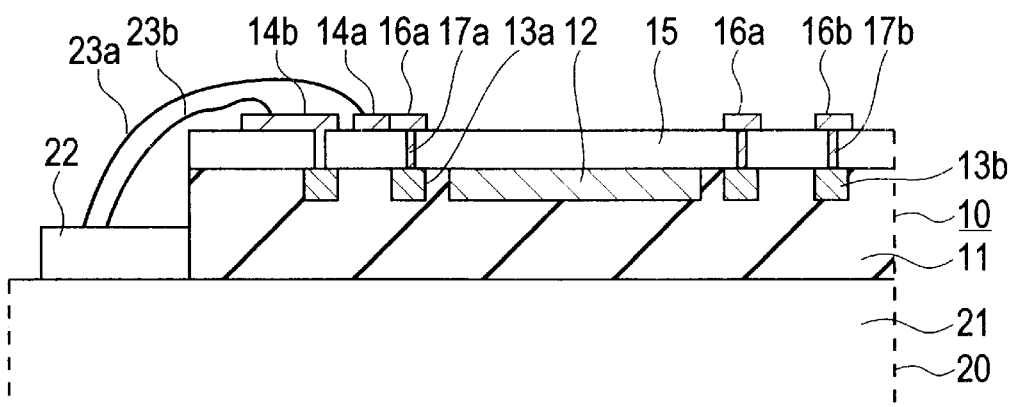

FIG. 1(A) and (B) show the constitution of a semiconductor device relating to a first embodiment of the present invention. FIG. 1(A) shows a plane diagram and FIG. 1(B) shows an expanded cross sectional view taken at line X—X in FIG. 1(A).

As shown in FIG. 1(A), this semiconductor device comprises an integrated circuit chip 10 (hereinafter "IC chip") and a package 20 whereon this IC chip 10 is installed. The IC chip 10 comprises a transistor formation region 12 wherein is formed a circuit including the transistors on a p-type semiconductor substrate 11, for example. A first guard ring 13a is formed around the transistor formation region 12 and a second guard ring 13b is formed to surround this first guard ring 13a.

Furthermore, a plurality of electrodes 14, for external connections of the circuit such as the transistors, is formed on the surface of the IC chip 10.

The package 20 mechanically fixes the IC chip 10 and connects the chip to external circuits. The package 20 comprises an insulating package substrate 21 and a plurality of metal external terminals 22 established on the periphery of this package substrate 21. Furthermore, the external terminals 22 of the package 20 and the electrodes 14 of the IC chip 10 are electrically connected by metal wires 23 of gold, for example.

FIG. 1(B) is a cross sectional view for showing the structure of the guard rings in the IC chip 10. The structures of the transistors and so forth that are not directly related to the present invention are omitted.

In the IC chip 10 as discussed above, the transistor formation region 12 is formed on the p-type semiconductor substrate 11 and a guard ring 13a, with a high concentration of p-type ions diffused therein, is formed to surround the transistor formation region 12. Furthermore, a guard ring 13b is formed around the outside of the guard ring 13a with a uniform gap therebetween. This guard ring 13b also has a high concentration of p-type ions diffused therein, like the guard ring 13a. The guard rings 13a and 13b have higher concentrations of impurities than the source and drain regions of the transistors formed in the transistor formation region 12.

An insulating film 15 of silicon dioxide or the like is formed on the surface of the semiconductor substrate 11 wherein are formed the transistor formation region 12, and the guard rings 13a and 13b. A metal film 16a is formed on the surface of the insulating film 15 at a location corresponding to the guard ring 13a. The metal film 16a and the guard ring 13a are electrically connected by a plurality of interlayer wires 17a of metal.

Furthermore, a metal film 16b is formed on the surface of the insulating film 15 at a location corresponding to the guard ring 13b. The metal film 16b and the guard ring 13b are electrically connected by plurality of interlayer wires 17b of metal. The metal films 16a and 16b are connected to the electrically independent electrodes 14a and 14b, formed on the insulating film 15.

This type of IC chip 10 is attached by adhesive or the like on the package substrate 21. The electrodes 14a and 14b of this IC chip 10 are connected by individual metal wires 23a and 23b to the external electrodes 22 for providing a shared standard potential to the package 20.

Figure 2:
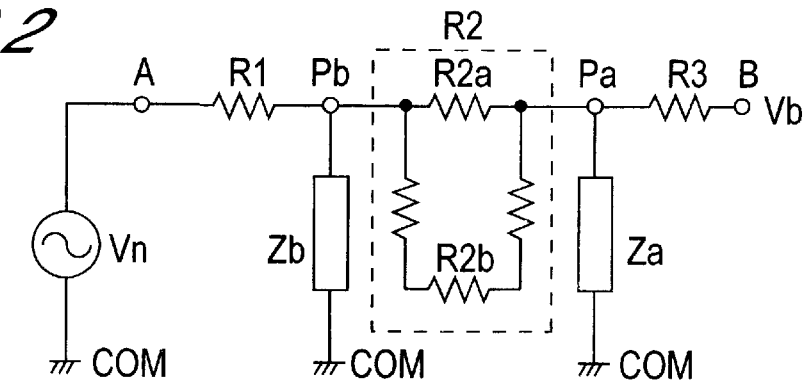
FIG. 2 is an equivalent circuit diagram of the guard ring in FIG. 1.

FIG. 2 shows an equivalent circuit for the guard rings in FIG. 1. The operation and effects of the guard rings in FIG. 1 are explained below with reference to FIG. 2.

Because the guard ring 13a is electrically connected to the metal film 16a by a plurality of interlayer wires 17a, the potentials of this guard ring 13a and the metal film 16a remain the same regardless of their relative locations. Likewise, because the guard ring 13b is electrically connected to the metal film 16b by a plurality of interlayer wires 17b, the potentials of the guard ring 13b and the metal film 16b remain the same regardless of their relative locations.

In FIG. 2, the node A corresponds to the electrode 14n of the IC chip 10 whereby a noise voltage Vn is provided from outside the circuit, for example. The nodes Pa and Pb correspond to the guard rings 13a and 13b respectively. The node COM corresponds to the standard potential electrode 22 in the package 20. Furthermore, the node B corresponds to the input terminal of the gate or the like of the transistors in the transistor formation region 12 on the IC chip 10.

As shown in FIG. 2, the node A and the node Pb are connected by the substrate resistor R1 of the semiconductor substrate 11. The node Pb is connected to the node COM by the impedance Zb of the metal wire 23b and to the node Pa by the substrate resistor R2 of the semiconductor substrate 11. The substrate resistor R2 is a combined resistor comprising the substrate resistor R2a connecting the guard rings 13a and 13b over the shortest distance, and the substrate resistor R2b forming a connection through the interior of the semiconductor substrate 11.

Furthermore, the node Pa is connected to the node COM by the impedance Za of the metal wire 23a and to the node B by the substrate resistor R3. If the input impedance of the transistor or the like connected to node B is infinity, the ratio of the noise voltage Vb in node B to the noise voltage Vn from outside becomes as shown in equation 1.

$$Vb/Vn = ((R2+Za)//Zb)/(R1+(R2+Za)//Zb) \times Za/(R2+Za) \quad (1)$$

Because the impedance Za and Zb of the metal wires 23a and 23b is very small compared to the resistance R1 and R2, equation 1 can be approximated with equation 2.

$$Vb/Vn = Zb \times Za/(R1+Zb) \times (R2+Za) \quad (2)$$

Consequently, the noise voltage Vb of node B is attenuated by the input noise voltage Vn and becomes a very small value.

As above, the semiconductor device relating to the first embodiment comprises two guard rings 13a and 13b independently connected to a standard potential, and can therefore effectively shield external noise.

Second Embodiment

Figure 3A:
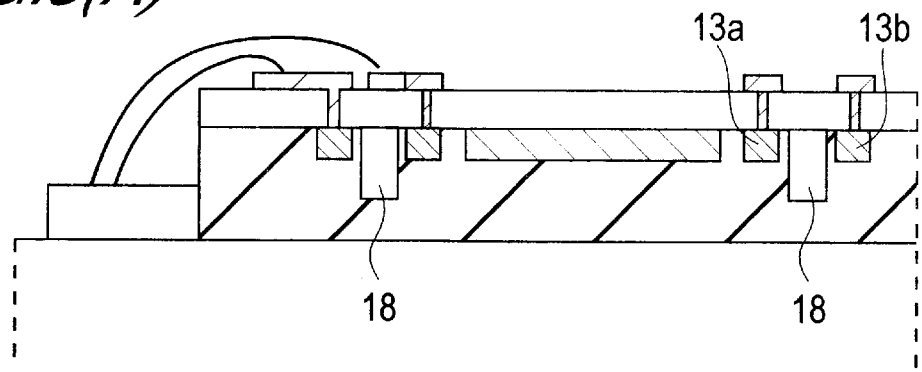
FIG. 3 (including FIG. 3(A) and FIG. 3(B)) is a drawing of the constitution and an equivalent circuit diagram of a semiconductor device relating to a second embodiment of the present invention.

FIG. 3(A) and (B) show a diagram of the constitution and an equivalent circuit for the semiconductor device relating to a second embodiment of the present invention. Corresponding to FIG. 1(B) FIG. 3(A) show a cross sectional view to clearly show the structure of the guard ring. In FIG. 3(A) and (B), the same symbols are used for elements shared with FIGS. 1 and 2.

In the semiconductor device in FIG. 3(A), a separating groove is established between the guard rings 13a and 13b in the semiconductor device in FIG. 1. The interior of this groove is filled with an insulating material 18 such as silicon dioxide. Other elements of the structure are the same as in FIG. 1.

Figure 3B:
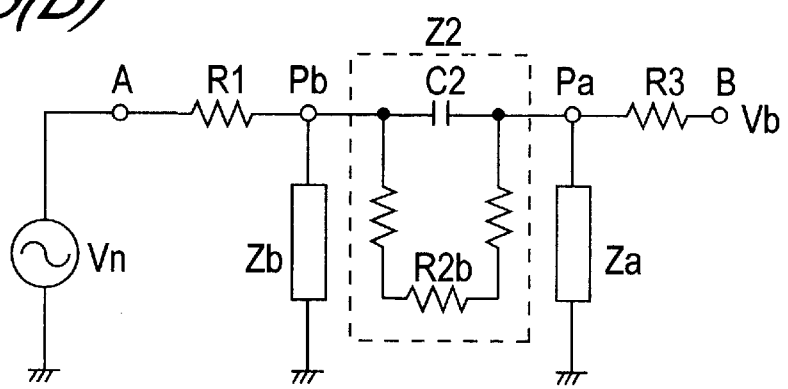

As shown in FIG. 3(B), the equivalent circuit of the guard rings of this semiconductor device has the substrate resistor R2 in FIG. 2 replaced with the substrate impedance Z2. The substrate impedance Z2 is a combined impedance comprising the capacitance C2 due to the insulating material 18 between the guard rings 13a and 13b and the substrate resistance R2b forming a connection through the interior of the semiconductor substrate 11. In other words, the substrate impedance Z2 in FIG. 3(B) has a greater value than the substrate resistance R2 in FIG. 2. Consequently, as clear from equation 2 above, the noise voltage Vb of node B is more attenuated than in the first embodiment.

As explained above, the semiconductor device relating to the second embodiment has the insulating material 18 established between two guard rings 13a and 13b that are independently connected to a standard potential. External noise can thereby be even more effectively shielded.

Third Embodiment

Figure 4A:
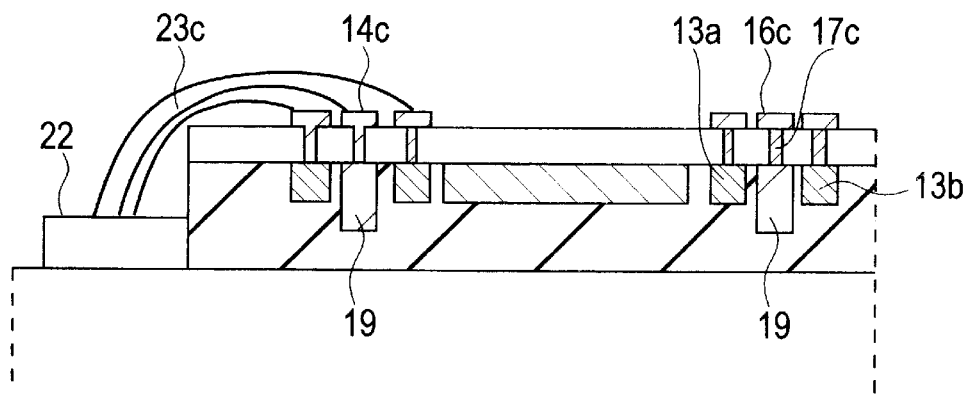
FIG. 4 (including FIG. 4(A) and FIG. 4(B)) is a drawing of the constitution and an equivalent circuit diagram of a semiconductor device relating to a third embodiment of the present invention.

FIG. 4(A) and (B) show a diagram of the constitution and an equivalent circuit for the semiconductor device relating to a third embodiment of the present invention. Corresponding to FIG. 1(B), FIG. 4(A) shows a cross sectional view to clearly show the structure of the guard rings. In FIG. 4(A) and (B), the same symbols are used for elements shared with FIGS. 1 and 2.

In the semiconductor device in FIG. 4(A), an n-type region 19, wherein a high concentration of n-type ions are diffused, is established between the guard rings 13a and 13b in the semiconductor device in FIG. 1. A metal film 16c is formed on the surface of the insulating film 15 at a location corresponding to the n-type region 19. This metal film 16c and the n-type region 19 are electrically connected by a plurality of interlayer wires 17c of metal. The metal film 16c is connected to the electrode 14c formed on the insulating film 15. This electrode 14c is connected by a metal wire 23c to an external electrode 22 for providing a standard potential to the package 20. Other aspects of the structure are the same as in FIG. 1.

Figure 4B:
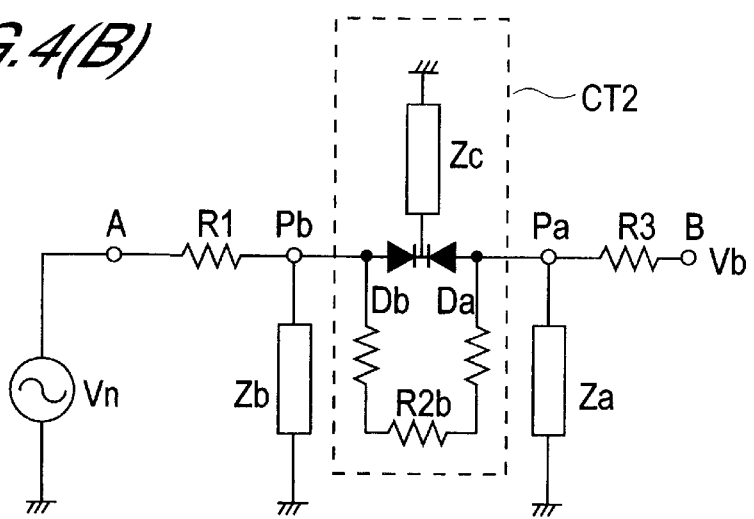

As shown in FIG. 4(B), the equivalent circuit of the guard rings of this semiconductor device has the substrate resistor R2 in FIG. 2 replaced with the semiconductor circuit CT2. This semiconductor circuit CT2 comprises a diode Da formed by the guard ring 13a and the n-type region 19, a diode Db formed by this n-type region 19 and the guard ring 13b, a substrate resistor R2b forming a connection through the interior of semiconductor substrate 11, and the impedance Zc of the metal wire 23c connecting the anodes of the diodes Da and Db (specifically, metal film 16c) with the external electrode 22.

Accordingly, an equivalent of three guard rings is formed and still better shielding effects can be achieved.

As explained above, the semiconductor device relating to the third embodiment has the n-type region 19 established between two guard rings 13a and 13b that are independently connected to a standard potential, and the n-type region is independently connected to the standard potential. External noise can thereby be even more effectively shielded than with the second embodiment.

Moreover, the present invention is not limited to these embodiments and can take various forms. Some examples of these forms are as in (a) through (c) below.

(a) A p-type semiconductor substrate was used in the embodiments, but an n-type semiconductor substrate can be applied in the same manner.

(b) Two guard rings were used in the embodiments, but any number of guard rings, two or more, may be used.

(c) In the semiconductor device in FIG. 4, the n-type region 19 was constituted so as to be connected to the standard potential, however the n-type region 19 may be simply established as shown in FIG. 3. In this case, the shielding effects are slightly lower than is the case in FIG. 4, but the structure can be simplified.

As explained in detail above, the first invention is constituted with two guard rings. In addition, the potential difference in the guard rings is eliminated by connecting these guard rings to first and second metal film patterns. Furthermore, the first and second metal film patterns are separately connected to the standard potential. Great shielding effects can thereby be attained.

The second invention has an insulating region established between the first and second guard rings in the semiconductor device relating to the first invention. Even better shielding effects can thereby be attained.

The third invention has two guard rings; the potential difference in the guard rings is eliminated by connecting these guard rings to first and second metal film patterns. At the same time, the first and second metal film patterns are separately connected to the standard potential. Moreover, a diffused region for constituting reversely connected diodes is established between the first and second guard rings. Great shielding effects can thereby be attained.

The fourth invention has the diffused region in the third invention connected to the standard potential. This results in a constitution with an equivalent of three guard rings, and therefore, even better shielding effects can be attained.

What is claimed is:

1. A semiconductor device comprising:
   a circuit region including transistors formed on a semiconductor substrate;
   a first guard ring of an ion diffused region formed around said circuit region;
   a second guard ring of a high concentration ion diffused region formed around said first guard ring with a prescribed gap therebetween;
   a first metal film electrically connected to the first guard ring via a contact hole formed through an insulating film;
   a second metal film electrically connected to the second guard ring via another contact hole formed through said insulating film;
   wherein said first metal film is supplied with a first potential;
   wherein said second metal film is supplied with said first potential;
   each of said transistors having a drain region and a source region; and
   wherein said first and second guard rings have higher concentrations of impurities than said drain region and said source region of said transistors.

2. A semiconductor device, according to claim 1, wherein an insulating region of insulating material is established between the first and second guard rings on said semiconductor substrate.

3. The semiconductor device of claim 1,
   wherein said first metal film is connected to said first guard ring by a plurality of interlayer wires; and
   wherein said second metal film is connected to said second guard ring by a plurality of interlayer wires.

4. The semiconductor device of claim 1,
   wherein said first metal film is connected to an external terminal by a first metal wire; and
   wherein said second metal film is connected to said external terminal by a second metal wire.

5. The semiconductor device of claim 1, wherein said given first potential is a ground potential.

6. The semiconductor device of claim 1, wherein each of said first and second guard rings is made of a first conductivity type diffusion layer.

7. The semiconductor device of claim 1, further comprising:
   a diffused region, formed within the semiconductor substrate, surrounding the first guard ring and being enclosed by the second guard ring; and
   a third metal film electrically connected to the diffused region via a third contact hole formed through the insulating film.

8. A noise shield for a semiconductor device comprising:
   a transistor formation region for forming transistors;
   a first guard ring surrounding the transistor formation region so as to enclose the transistor formation region;
   a second guard ring surrounding the first guard ring so as to enclose the first guard ring;
   wires for applying a common potential to both the first and second guard rings;
   a transistor formed within the transistor formation region, the transistor having a drain region and a source region; and
   wherein the first and second guard rings have higher concentrations of impurities than the drain region and the source region of the transistor.

9. The noise shield of claim 8, wherein the common potential is a ground potential.

10. The noise shield of claim 8, further comprising:
    an insulating film placed on top of the transistor formation region; and
    first and second metal films connected to said first and second guard ring, respectively, by interlayer wires formed of said plural wires, wherein said interlayer wires pass via contact holes formed through the insulating film.

11. The noise shield of claim 10, wherein an insulating region of insulating material is formed between the first and second guard rings.

12. The noise shield of claim 10, further comprising:
    a diffused region formed between the first and second guard rings; and
    a third metal film electrically connected to the diffused region by said interlayer wires formed of said plural wires via a contact hole formed through the insulating film.

13. A guard ring structure for providing a noise shield comprising:
    a transistor formation region;
    plural transistors formed within the transistor formation region, each having a source region and a drain region;

a first guard ring surrounding the transistor formation region;

a second guard ring surrounding the first guard ring;

a common external terminal to which the first and second guard rings are connected and to which a common potential is applied for supplying the common potential to the first and second guard rings; and wherein the first and second guard rings have higher concentrations of impurities than the drain regions and the source regions of said plural transistors.

14. The guard ring structure of claim 13, wherein the common potential is a ground potential.

15. The guard ring structure of claim 13, further comprising:

an insulating film placed on top of the transistor formation region; and first and second metal films connected to said first and second guard ring, respectively, by interlayer wires, wherein said interlayer wires pass via contact holes through the insulating film.

16. The guard ring structure of claim 15, wherein an insulating region of insulating material is formed between the first and second guard rings.

17. The guard ring structure of claim 15, further comprising:

a diffused region formed between the first and second guard rings; and a third metal film electrically connected to the diffused region by interlayer wires via a contact hole formed through the insulating film.

* * * * *